United States Patent [19]

Marbot

[11] Patent Number: 5,412,688

[45] Date of Patent: May 2, 1995

[54] PROCESS AND CIRCUIT FOR DETECTING TRANSMISSION USING BI-DIRECTIONAL DIFFERENTIAL LINKS

[75] Inventor: Roland Marbot, Versailles, France

[73] Assignee: Bull, S.A., Paris, France

[21] Appl. No.: 199,354

[22] Filed: Feb. 18, 1994

Related U.S. Application Data

[63] Continuation of Ser. No. 842,973, Feb. 28, 1992, abandoned.

[30] Foreign Application Priority Data

Mar. 14, 1991 [FR] France ................... 91 03127
Jun. 27, 1991 [FR] France ................... 91 08001

[51] Int. Cl.⁶ .................... H04L 5/16; H04L 27/00
[52] U.S. Cl. ................... 375/220; 375/259; 455/343; 327/77
[58] Field of Search .......... 375/7, 36, 37; 307/360, 307/362, 355, 358, 363; 455/343, 38.3

[56] References Cited

U.S. PATENT DOCUMENTS 3,700,831 10/1972 Aagaard et al. .
3,909,559 9/1975 Taylor .

FOREIGN PATENT DOCUMENTS 0026931 4/1981 European Pat. Off. .
0067310 12/1982 European Pat. Off. .
0186142 7/1986 European Pat. Off. .
0220626 5/1987 European Pat. Off. .

OTHER PUBLICATIONS

Patent Abstract of Japan, vol. 7, No. 280, Dec. 1983.
Patent Abstract of Japan JP 59 159 406, vol. 9, No. 47, Feb. 27, 1985.

*Primary Examiner*—Stephen Chin
*Assistant Examiner*—Hai H. Phan
*Attorney, Agent, or Firm*—Kerkam, Stowell, Kondracki & Clarke; Edward J. Kondracki

[57] ABSTRACT

In certain bidirectional transmissions, differential links (L, L*) are used and transceivers (1) that furnish differential measurement signals (V, V*) representative of the transmission signals of the remote station are used. To reduce power consumption, the electrical power to the transceivers (1) may be interrupted during periods of inactivity. The method of the present invention consists in determining a threshold value which is intermediate in value between the maximum and minimum values that can be assumed by the measurement signals (V, V*), and furnishing a signal (VAL) representative of transmission activity resulting from the comparison between the measurement signals (V, V*) and the threshold value. The circuit for employing the method uses voltage comparators and may be an integrated circuit.

21 Claims, 4 Drawing Sheets

PROCESS AND CIRCUIT FOR DETECTING TRANSMISSION USING BI-DIRECTIONAL DIFFERENTIAL LINKS

This is a Continuation of application Ser. No. 07/842,973, filed Feb. 28, 1992, which is abandoned.

CROSS REFERENCE TO RELATED APPLICATIONS

This application is related to the following copending applications of applicant:

BULL US 3277 "Transceiver for Bi-Directional Link, Integrated Circuit Including the Transceiver and Application to Communication Between Units", U.S. Ser. No. 07/843,210, filed concurrently herewith and corresponding to French 91.03127 filed Mar. 14, 1991.

BULL US 3280 "Integrated Circuit Having Controlled Impedances and Application to Transceivers, In Particular for Communication Between Units of a System", U.S. Ser. No. 07/843,202, filed concurrently herewith and corresponding to French 91.03125 filed Mar. 14, 1991.

BULL US 3290 "Processes for Testing for Bi-directional Serial Transmissions and Circuits for Their Implementation", U.S. Ser. No. 07/843,547, filed concurrently herewith and corresponding to French 91.03126 filed Mar. 14, 1991.

TECHNICAL FIELD OF THE INVENTION

The invention is in the field of digital data transmission between stations or units by way of serial bi-directional links of the point-to-point type, and using differential transmission lines. These lines may be twisted pairs or coaxial cables connected at each end to a station, via a transmitter and a receiver associated with the station.

BACKGROUND

For numerous applications, it is preferable to use a transmission mode authorizing simultaneous transmission in both stations, for better utilization of the lines. An example of a particularly suitable application is the interconnection among the units of a central information process subsystem including a large number of units. When the number of processors and memories becomes large, the selection of a bus to effect the exchanges of information between all these units is no longer appropriate. It is preferable in this context to use serial links, connecting each unit to all the other units of the system in such a way as to increase the parallelism. Considering the large number of links required in such a system, the choice of bi-directional links is preferable.

Such bi-directional transmission necessitates the presence in each station of a transceiver connected to the lines by adaptation impedances. The receiving part of the transceiver includes means that can handle collisions, that is, simultaneous transmission over the common link by the transmitters of two stations connected to one another. These means must under all circumstances permit the detection, from the electrical state of the line, of the existence and nature of the signals transmitted by the remote station.

To solve this problem, the principle typically used is that of compensation in the receiver for the effect produced on the line by the transmitter of the same station when it is transmitting. Thus in the case of transmission, a subtraction of the signal present on the line from the transmission signal is performed. The difference obtained is then representative of the signal transmitted by the transmitter of the remote station. This embodiment is for instance described in European Patent Application EP-A-186142, published Jul. 2, 1986, entitled "Two wire bidirectional digital transmission system".

Another solution consists not in subtracting the transmission signal from the line signal when the transmitter of the station in question is transmitting, but contrarily to add the line signal, when the station is not transmitting, to a compensation signal of the same polarity, suitably chosen so that the resultant sum will be representative of the only transmission signal of the other station.

It is understood that these transmission and reception means are embodied by means of electronic circuits that have to be powered electrically. To obtain fast circuits, technologies that use bipolar transistors, such as ECL (emitter-coupled logic), are chosen. As a result, the consumption of energy by the circuits at rest is not insignificant and may cause exaggerated heating of the circuits. In the example of interconnection among a large number of units, integrated circuits are thus advantageously used to make the interface between each unit and the other units of the systems. Each integrated circuit can then include a large number of transceivers, among which only some of them are active simultaneously. All those that are at rest will then increase the useless power consumption and heating.

To solve this problem, it is accordingly desirable to be able to cut the power to the transceivers, or at least their power circuits, when they are not used for either transmission or reception.

However, the capability of cutting the power to the transceivers must nevertheless still enable reliable transmission operation. Thus in a station in question, where a power of the transceiver is cut, it must always be possible to detect whether the station to which this transceiver is being connected is transmitting a signal or not, because if a signal is transmitted, then the supply to the transceiver in question must immediately be re-established.

SUMMARY OF THE INVENTION

Thus it is the object of the invention to solve this problem by proposing a method for detecting transmission that is adapted to differential bi-directional links and that enables cutting the power to the transceivers.

More precisely, the subject of the invention is a method for detecting transmission for a transmission system using at least one transceiver connected via two differential transmission lines to another similar transceiver, the transceiver including differential amplification means for producing differential transmission and reception signals, the amplification means including, for each transmission line, one impedance for adaptation to the line and connected to it, one transmission signal generator commanded in response to transmission command signals and supplying the impedance and the line in parallel, and reception means for furnishing a measurement signal that is representative of the algebraic sum of the current circulating in the adaptation impedance and a compensation current, such that the measurement signal depends practically only on the transmission signals produced by the other transceiver, the power supply to the amplification means being capable of being activated or inhibited as a function of a power command signal, the method being characterized in that it consists, in each transceiver, in determining a threshold value representative of a current of intermediate value between the maximum and minimum values that can be assumed by the currents represented by the measurement signals, comparing the measurement signals of each line with the selected threshold value, and producing a signal representative of the activity of the transmission as a function of the comparisons, depending on whether or not the threshold value is between the values of the measurement signals.

To determine whether the threshold value is or is not between the values of the measurement signals, one can verify whether one of the measurement signals represents a current higher in absolute value than the current represented by the threshold value. If so, the transmission is active.

Another possibility equivalent to the preceding one consists in verifying whether the measurement signals represent currents that are simultaneously less in absolute value than the current represented by the threshold value. If so, the transmission is inactive.

One or the other of the above possibilities may be selected as a function of the ease of employment, depending on the context and on the technology used. It may be noted that if ECL technology is used, both these solutions lead to an identical embodiment of the circuits.

The invention also relates to a circuit for detecting transmission, intended to be associated with a transceiver of the type defined above and adapted especially to employing the method of the invention. This circuit is characterized in that, the measurement signals being voltages, the detection circuit includes a voltage generator furnishing the threshold value.

In another feature of the invention, the circuit is characterized in that it includes two comparators for respectively comparing the measurement signals with the threshold value, the outputs of the comparators being applied to the input of a logic gate furnishing a signal representative of the activity of the transmission.

In certain cases, a single threshold value is not sufficient for correct detection of the transmission activity. For example, if compensation by addition is used, then the maximum and minimum values of the measurement signals would depend on the state of power supply of the amplification means.

In order to provide this possibility, and in another feature of the invention, the circuit is further characterized in that in the case where the threshold value depends on the power state of the amplification means of the transceivers, the voltage generator is a variable voltage generator, commanded by the power command signal.

The invention also relates to an integrated circuit including a plurality of transceivers of the type defined above. This integrated circuit includes means for activating or inhibiting the power supply to the amplification means of each transceiver via a power command signal and further includes a transmission detection circuit according to the invention associated with each transceiver.

Further aspects, details of embodiment and advantages of the invention will be discussed in the ensuing description.

DESCRIPTION OF THE PREFERRED EMBODIMENTS

Figure 1:
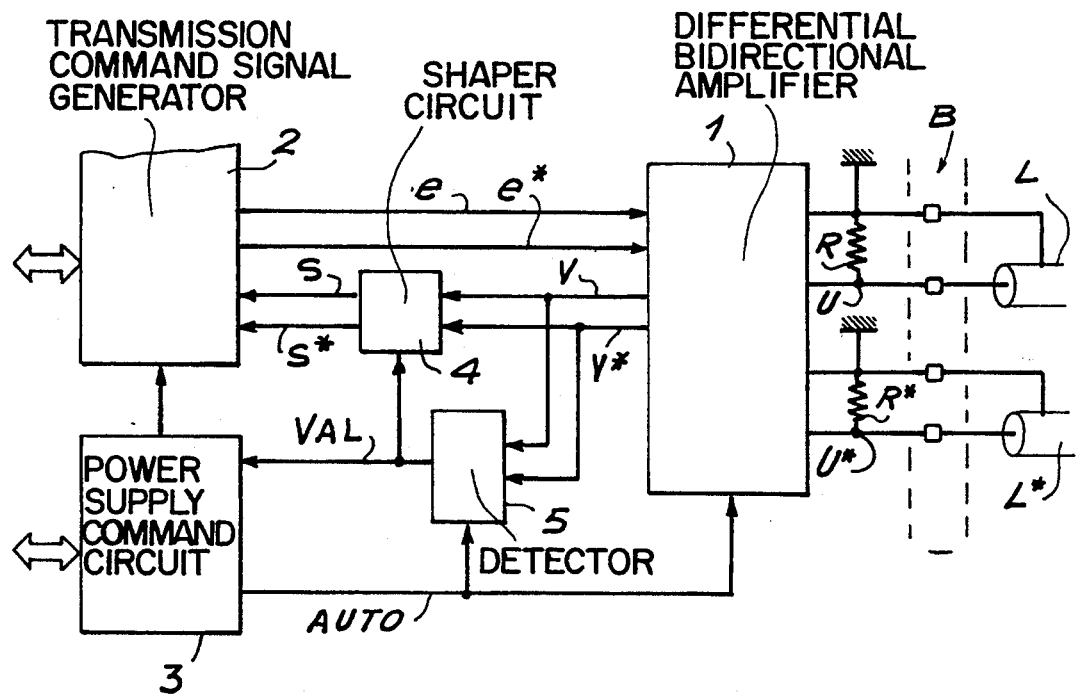
FIG. 1 is a schematic view of a transceiver device using the method of detection according to the invention.

FIG. 1 as a whole shows a transceiver device in which the method of the invention is employed. By way of non-limiting example, it consists of a parallel-serial, serial-parallel interface circuit that can be used to make the interconnection among the units of an information processing system. It would advantageously be embodied in the form of an integrated circuit including a plurality of bidirectional differential transceivers.

In FIG. 1, only one of the transceivers is shown. It is composed of a differential bidirectional amplifier 1, with which a shaping circuit 4 and a transmission detector 5 according to the invention are associated. The amplifier 1 includes two differential inputs/outputs U, U*, which each supply power in parallel to an adaptation impedance R, R* and an associated line L, L*. The electrical connection between the adaptation impedances R, R* and the lines L, L* is effected via terminals B of the integrated circuit.

At its input, the amplifier 1 receives differential transmission signals e, e* furnished by a transmission command signal generator 2, which for example is a serializer-deserializer connected via parallel inputs/outputs to an associated unit, not shown.

The amplifier 1 furnishes the differential measurement signals V, V*, which are representative of the signals transmitted by another station, connected to the end of the lines L, L*.

A power supply command circuit 3, under the control of the associated unit, furnishes signals AUTO that command the power supply to the power circuits of each amplifier. The circuit 3 may advantageously also command the power supply of the serializer-deserializer 2.

At its input, the transmission detector 5 receives the measurement signals V, V* and the power command signal AUTO, and it furnishes a signal VAL representative of transmission activity on the part of the remote station.

A shaping circuit 4 receives the measurement signals V, V* and the activity signal VAL and furnishes the differential reception signals s, s* to the command signal generator circuit 2.

The circuit of FIG. 1 functions as follows: In normal operation, the transceivers of the station in question and of the remote station are supplied with power. In the case of prolonged absence of an exchange of information between the stations, each unit may send to the power command circuit 3 the order to cut the power supply. If the power to the transceiver of the remote station is cut, this translates into an absence of a differential signal V, V*, which is detected by the circuit 5. Consequently, this circuit puts the signal VAL at 0. The circuit 4 then forces its outputs s and s* to 0 and 1, respectively. On the other hand, the signal VAL is transmitted by the circuit 3 to the associated unit. As a function of predetermined criteria, the unit may command the cutting of power to the circuit 3, which in that case puts the AUTO signal at 0.

If the remote station resumes transmission, the existence of a differential voltage V, V* is detected by the circuit detector 5, which then puts the signal VAL at 1. The change in state of the signal VAL is detected by the circuit 3, which automatically maintains or re-establishes the power supply to the amplifier 1 and to the serializer-deserializer 2 by putting the signal AUTO at 1. Moreover, the signal VAL enables the shaping circuit 4, which then functions as a differential amplifier.

As will be seen in detail in the ensuing description, the input AUTO of the circuit 5 is provided in the case where the levels V, V* depend on the power supply state of the transceiver.

Figure 2:
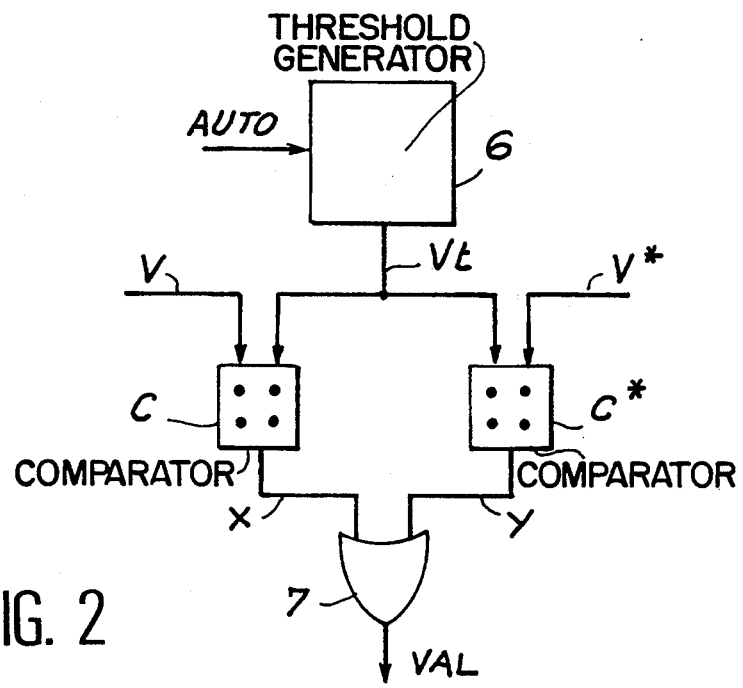
FIG. 2 shows the transmission detection circuit.

FIG. 2, in the form of a block diagram, shows the transmission detection circuit according to the invention. It includes a threshold generator 6 that furnishes a threshold value Vt as a function of the logical value of the signal AUTO. Two comparators C and C* respectively compare the measurement signals V and V* to the threshold value Vt. The outputs x and y of the comparators C and C* are applied to the input of a logic gate 7, the output of which furnishes the activity signal VAL.

Before the operation of FIG. 2 is described, it is appropriate to state that each measurement signal V or V* is representative of the algebraic sum of a current circulating in the associated adaptation impedance R or R* and a compensation current the value of which is such that the measurement signal V, V* depends practically only on the transmission signals produced by the other transceiver. In addition, the threshold value Vt furnished by the generator 6 is representative of a current of intermediate value between the maximum and minimum values that may be assumed by the currents represented by the measurement signals V, V*. On the other hand, the inputs of the comparators C and C* to which the signals V, V* and Vt are applied are selected such that each output x or y assumes the value of logical 1 when the associated measurement signal V or V* represents a current greater in absolute value than the current represented by the threshold value Vt. In that case, the logic gate 7 is an OR gate, and its output VAL will assume the value of logical 1 when a differential signal V, V* exists.

In a variant, the inputs of the comparators C, C* could be reversed. Then, each output x or y would assume the value of logical 1 when the associated measurement signal V or V* represents a current less in absolute value than the current represented by the threshold value. In that case, the gate 7 could be an AND gate furnishing an inactivity signal VAL*, which is the complement to VAL. Contrarily, if a NOR gate is used, then it furnishes the signal VAL directly.

Figure 4:
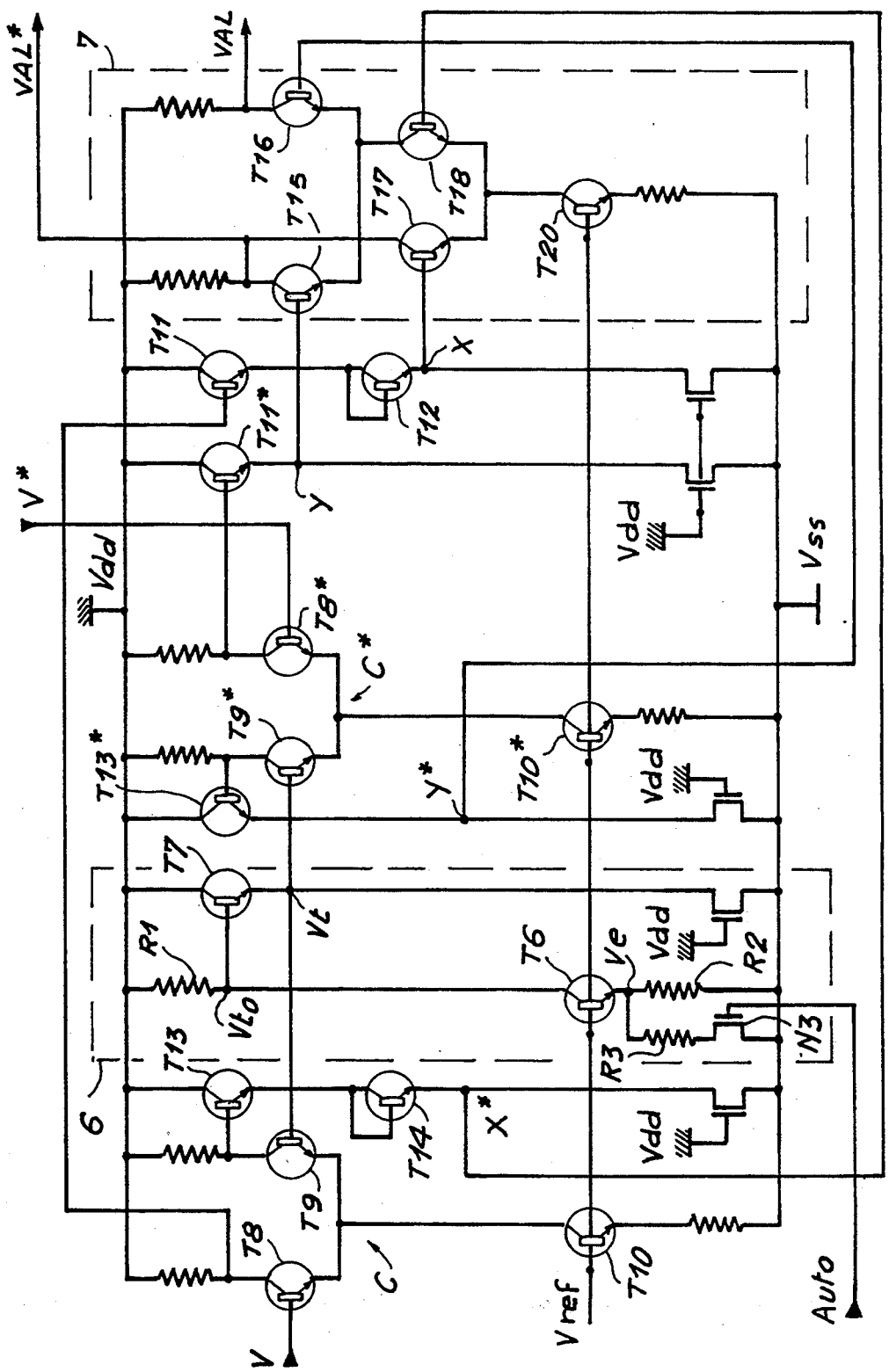
FIG. 4 shows an ECL embodiment of the transmission detection circuit according to the invention.

As will be seen in detail with reference to FIG. 4, an ECL embodiment furnishes the signals VAL and VAL* simultaneously at its differential output.

Figure 3:
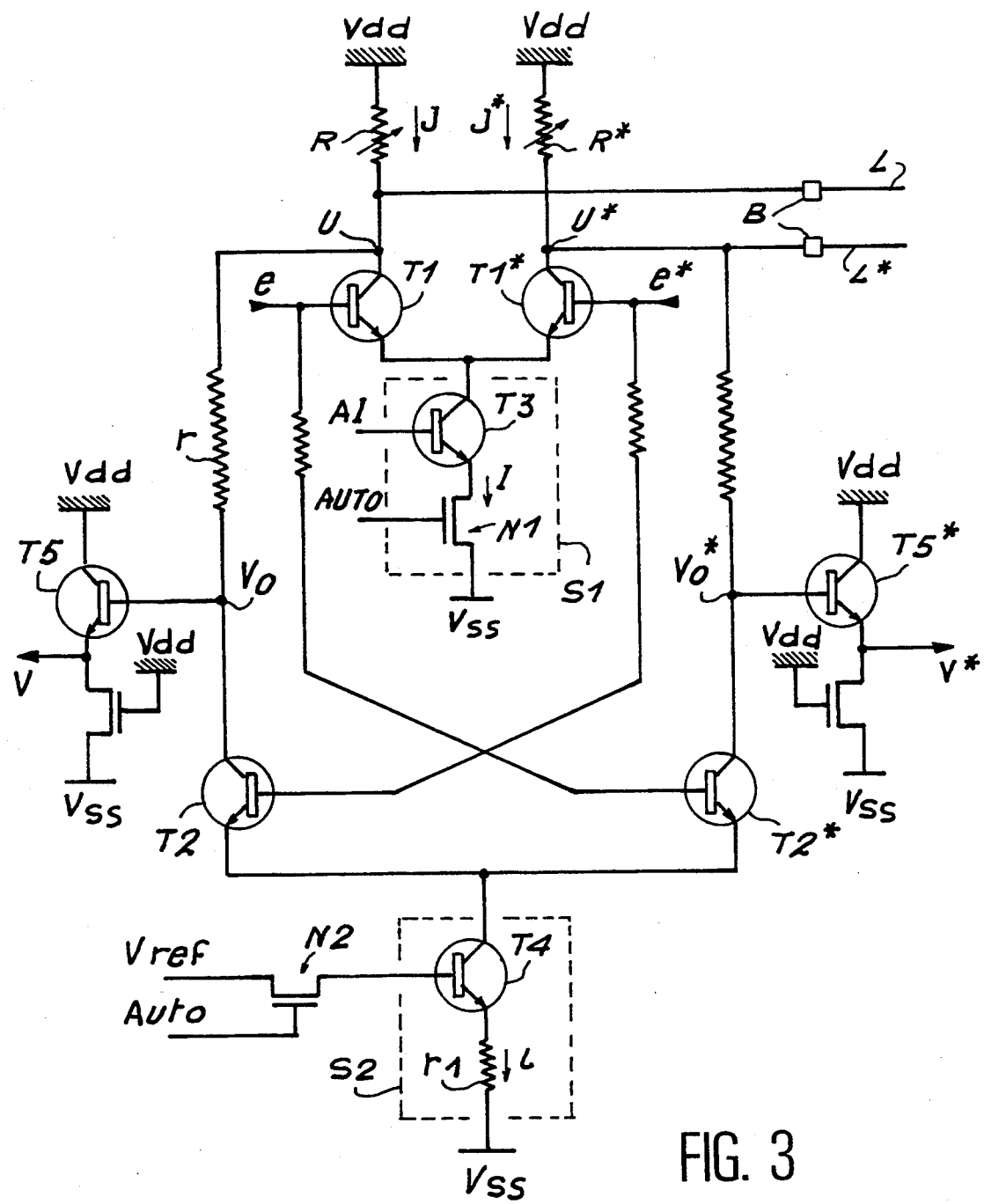
FIG. 3 shows an embodiment in ECL technology of the differential amplification means.

FIG. 3 shows a particular ECL embodiment of a bi-directional differential-type amplifier. It includes two signal paths or channels disposed symmetrically and connected respectively to the lines L, L* of the differential link. The left-hand signal path associated with the line L includes an adaptation impedance R, one terminal of which is connected to the ground potential Vdd and the other terminal of which is connected via the point U to the line L and to the collector of a bipolar transistor T1, whose emitter is connected to a first current source S1 that is common to both channels. The base of the transistor T1 receives the transmission command signal e. The collector of the transistor T1 is connected to the collector of a second transistor T2 by way of an impedance r and terminal V. The base of the transistor T2 receives the signal e*, which is the complement of e, and its emitter is connected to a second current source S2 common to both signal paths or channels. Symmetrically, the right-hand signal path channel includes an adaptation impedance R*, one terminal of which is connected to ground and the other of which is connected via the point U* to the line L* and to the collector of a transistor T1*, the emitter of which is connected to the current source S1. The collector of the transistor T1* is connected to the collector of a second transistor T2* by way of another impedance r and terminal V0*. The emitter of the transistor T2* is connected to the second current source S2. The transistors T1* and T2* receive the signals e* and e, respectively, at their bases. The signals e and e* that constitute the differential command signals are complementary and are representative of a predetermined logical value. They are in fact applied respectively to the base of the transistors T2* and T2 by way of resistors serving to compensate for the time constant due to the structural capacity of the impedances R and R*.

The current source S1 is constituted by a bipolar transistor T3, whose collector is connected to the emitters of the transistors T1 and T1* and whose emitter is connected to the negative potential Vss by way of the drain-to-source path of an NMOS transistor N1. The base of the transistor T3 is commanded by an adjustment voltage AI, and the gate of the transistor N1 receives the power command signal AUTO. Similarly, the second current source S2 is constituted by a bipolar transistor T4, whose collector is connected to the emitters of the transistors T2 and T2* and whose emitter is connected to the potential Vss by way of a resistor r1. The base of the transistor T4 is connected to a polarization voltage Vref by way of the drain-to-source path of an NMOS transistor N2, whose gate is commanded by the signal AUTO. The collectors V0 and V0* of the transistors T2 and T2* are respectively connected to the input of emitter-followers, which are respectively constituted by transistors T5 and T5*, and an NMOS transistor connected as a resistor, connecting the emitter of the bipolar transistor to the potential Vss, the collectors of the transistors T5 and T5* being connected to ground. The emitters of the transistors T5 and T5* constitute the differential outputs V, V* of the amplifier.

The values of the impedance r and currents i and I are selected in such a way as to verify the relationship: $ri = R \cdot I/2$, so that the voltages at the point V0 and V0* will depend practically only on the transmission signals of the remote station. Advantageously, an automatic control circuit (not shown) will be provided, acting upon the current I via the adjusting voltage AI as a function of the difference between ri and RI/2.

To explain the operation of the circuit of FIG. 3, the convention of positive logic will be used, in which a signal assumes the value of logical 1 when the corresponding voltage is high relative to the fixed negative potential Vss. In addition, a differential signal such as e, e* is assumed to take the value of logical 1, when e=1 and e*=0.

In normal operation, the signal AUTO=1. The current sources S1 and S2 are then active and they output the currents I and i, respectively. If the differential transmission command signal e, e* is at 1, the transistor T1 is conducting and the transistor T1* is blocked. Since in principle the adaptation impedance R has a value equal to the characteristic impedance of the line L, the transistor T1 inserts a current in the vicinity of I/2 into the adaptation impedance R and into the line. If the remote station is itself active, that is, if the bidirectional amplifier connected to the ends of the lines L, L* is supplied with power, then a current practically equal to I/2 (except for slight losses) is inserted into one of the impedances R or R*, depending on the logical value of the differential transmission command signal applied to the remote amplifier.

On the other hand, the transistor T2* is made conducting by the signal e=1 applied to its base, while the transistor T2 is blocked by the signal e*=0 at its base. A current i is thus inserted into the resistor r of the right-hand signal path. Since I, i and r are selected so as to have the ratio ri=RI/2, the voltages with respect to the points V0 and V0* will respectively assume the values −RI and −RI/2 or −RI/2 and −RI, depending on the logical value of the differential transmission command signal of the remote station. It can easily be verified that V0 and V0* assume the same values when the logical value of the differential transmission command signal e, e* is at 0.

If the two stations are at rest, no current is supplied to the impedances R and R*. The voltages with respect to ground at the points V0 and V0* are accordingly zero.

If on the other hand only the remote station is at rest, the voltages at the points V0 and V0* simultaneously assume the value −RI/2.

If finally, only the station in question is at rest, the voltages at the point V0 and V0* will assume the values of −RI/2 and 0, or 0 and −RI/2, respectively, depending on the logical value of the differential transmission command signal of the remote station.

Thus if a first threshold value equal to −RI/4 or −3RI/4 is selected, depending on whether the station is question is inactive or active, respectively, it is possible to detect the transmission activity by comparing the voltages at the point V0 and V0* with this threshold value; activity is found when the voltage at one of the points V0 and V0* is less in algebraic value than this threshold value. In equivalent fashion, the inactivity of the transmission can be found if the two voltages V0, V0* are simultaneously greater than this threshold value.

It can be noted that a single threshold would be necessary in the case where the bidirectional amplifier performed the compensation by subtraction, as has been mentioned above.

The emitter-follower assemblies T5 and T5*, which serve as an impedance adapter, furnish the voltages V and V* that are applied to the differential inputs of the ECL transmission detection circuit 5 shown in FIG. 4.

The circuit of FIG. 4 is composed essentially of two voltage comparators C and C*, associated with the signals V and V*, respectively, and a threshold voltage generator 6 and a logic gate 7.

The voltage generator 6 includes a bipolar transistor T6, whose base receives a polarization voltage Vref and whose collector Vto is connected to the ground potential Vdd by way of a first resistor R1. Its emitter is connected to the negative potential Vss by way of the assembly formed by a second resistor R2 connected in parallel to the serial assembly formed by a third resistor R3 and the drain-to-source path of an NMOS transistor N3, the gate of which receives the signal AUTO. The resistor R3 and the transistor N3 are thus equivalent to a resistor that is capable of being connected to or disconnected from the potential Vss as a function of the signal AUTO. This equivalent resistance then has a value r3, equal to the sum of the resistance R3 and the resistance of the drain-to-source path of the transistor N3. The choice of resistances R1, R2, r3 will make it possible to establish two voltage levels Vto corresponding to the two threshold values.

Thus the dimensioning of the generator 6 may be made as follows. Generally, the value of the product RI is a datum that fixes the dynamics of the transceiver signals. On the other hand, the polarization voltage Vref applied to the base of the transistor T6 is the same as that applied to the transistor T4 of the second current source S2 of the amplifier. Consequently, the emitter voltage of the transistor T6 is fixed at the value Vref, offset by the base-to-emitter voltage drop, which is practically constant, of the transistor T6. Thus the voltage Ve at the terminals of the resistor R2 is fixed and is equal to the voltage at the terminals of the resistor r1 of the current source S2.

It has been seen in conjunction with FIG. 3 that the two threshold values to be used for this particular embodiment or the voltages with respect to ground, equal −3RI/4 and −RI/4, depending on whether or not the amplifier is supplied with power. Consequently, the resistors R1, R2 and r3 must verify the following equations:

$$(R1/R2)Ve = -RI/4 \qquad (1)$$

$$R1(1/R2 + 1/r3)Ve = 3RI/4 \qquad (2)$$

By deduction, r3=R2/2, and R1=R2RI/4Ve. If furthermore one selects r1=r, and since ri=RI/2, then Ve=RI/2, and consequently R1=R2/2.

Thus by automatic control of the current I of the current source S1 by means of the base voltage AI of the transistor T3, in such a way as to permanently maintain the relationship ri=RI/2, the threshold voltage Vt0 furnished by the generator 6 will assume the two values desired, regardless of fluctuations in the power supply voltages and process variations.

The threshold voltage Vt0 is applied to the input of the comparators C and C* by way of an emitter-follower including the transistor T7, whose collector is connected to ground and whose emitter is connected to the potential Vss by the resistance of the drain-to-source path of an NMOS transistor connected as a resistor. The emitter of the transistor T7 furnishes the voltage Vt, which is equal to the voltage Vto, offset by the base-to-emitter voltage drop of the transistor T7. This offset in voltage corresponds precisely to the offset between the voltages V and V0, or V* and V0*, of the amplifier of FIG. 3. Thus these voltages Vt, V0 and V0* can be applied directly to the input of the comparators C and C*.

With the exception of their output stages, the comparators C and C* are identical in construction. Accordingly, only the comparator C will be described hereinafter, and each identical element of the comparator C* has the same reference symbol with the *.

The comparator C includes two transistors T8, T9 connected to one another by their emitter, and whose collectors are each connected to ground by way of a resistor. It includes a current source, embodied by the transistor T10, whose emitter is connected to negative potential Vss by way of a resistor, its collector being connected to the emitters of the transistors T8 and T9 and its base receiving the polarization voltage Vref. The collectors of the transistors T8 and T9 are respectively connected to the inputs of emitter-follower circuits, respectively, T11, T12 and T13, T14, and NMOS transistors connected as resistors. The collector of the transistor T8 is connected to the base of the transistor T11, whose collector is connected to ground and whose emitter is connected to the potential Vss by way of the transistor T12 connected as a diode, and by way of the drain-to-source path of an NMOS transistor. The emitter-follower associated with the transistor T9 is of identical construction; the transistors T13 and T14, respectively, play the role of the transistors T11 and T12 of the preceding emitter-follower. The emitter-followers of comparator C* are similar in construction but do not include the transistors T12 and T14, whose role is to offset the voltages by a value equal to the base-to-emitter voltage of the bipolar transistors used in this circuit, in such a way as to adapt the voltage levels to the downstream circuit 7.

The emitters of the transistors T12 and T14, which are designated x and x* respectively, constitute the differential output of the comparator C, and the emitters of the transistors T11* and T13* connected to points y and y* constitute the differential output of the comparator C*. The points x, x*, y and y* are applied to the input of the ECL OR gate 7. It includes two transistors T15, T16, connected to one another by their emitters, and whose collectors are connected to ground by way of resistors. The collector of the transistor T15 is connected to the collector of a third transistor T17, whose emitter is connected to the emitter of a fourth transistor T18 whose collector is connected to the emitters of the transistors T15 and T16. The emitters of the transistors T17 and T18 are connected to the collector of the transistor T20, whose emitter is connected to the potential Vss by way of a resistor. The base of this transistor T20 receives the polarization voltage Vref. The points x, x*, y and y* are connected to the bases of the transistors T17, T18, T15, and T16, respectively. The collectors of the transistors T16 and T15 constitute the differential output of the gate 7 and furnish the differential activity signal VAL, VAL*.

The circuit of FIG. 4 functions as follows. When the transceiver of the remote station is not supplied with power, the voltages V and V* are algebraically greater, with respect to ground, than the threshold value Vt. The transistors T8 and T8* are then conducting and the transistors T9 and T9* are blocked. The transistors T11 and T11* are then blocked, while the transistors T13 and T13* are conducting. The differential outputs x, x* and y, y* of the comparators C and C* then assume the value of logical 0. The transistors T15 and T17 are then blocked, and the transistors T16 and T18 are conducting. The voltage VAL* at the collector of the transistor T15 is equal to the ground potential Vdd, and the voltage VAL at the collector T16 assumes a lesser value, which signifies that the differential signal VAL, VAL* represents the value of logical 0.

Contrarily, if the remote station is active, then only one of the voltages V or V* is less than the threshold value Vt. As a result, one of the transistors T15 or T17 is conducting, and one of the transistors T16 or T18, respectively, is blocked. The differential output VAL, VAL* then assumes the value of logical 1.

Figure 5:
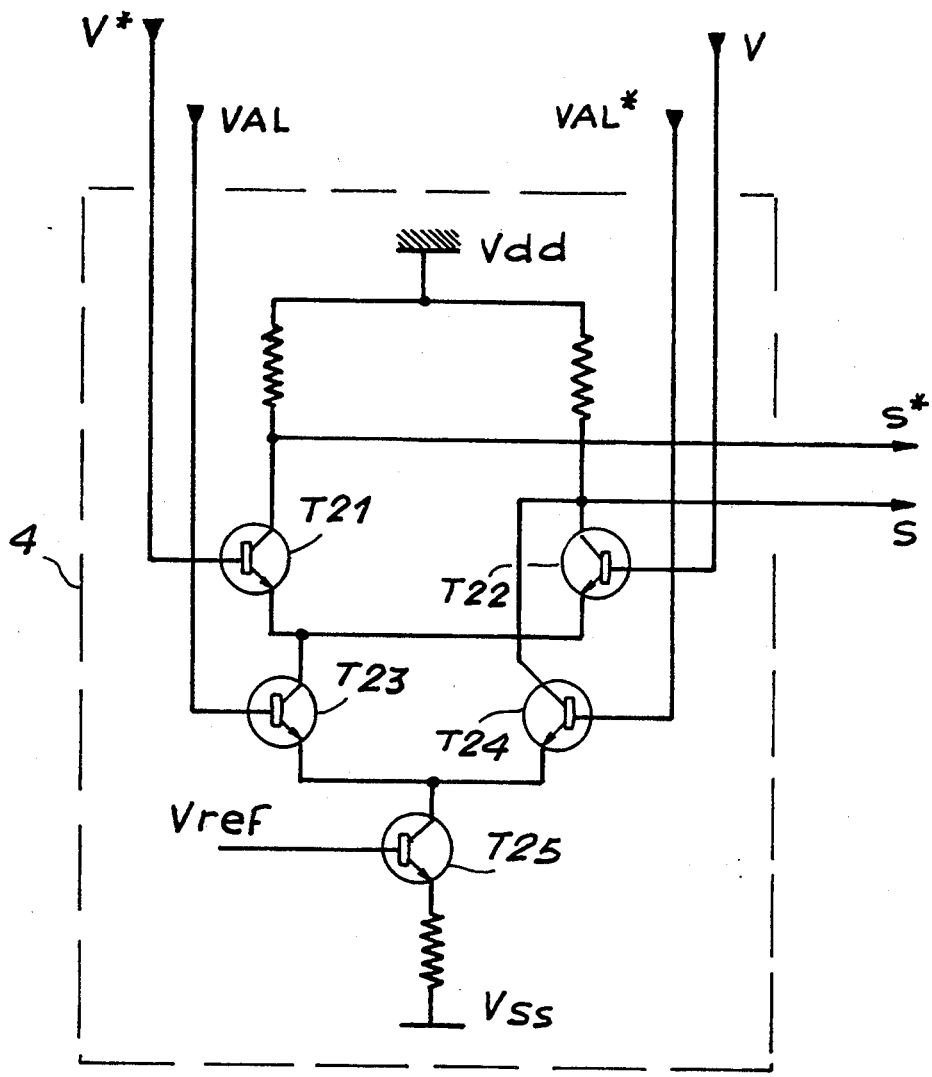
FIG. 5 shows an ECL embodiment of a circuit for shaping the output signals of the transceiver.

FIG. 5 shows an embodiment of the shaping circuit 4 of the output signals of the transceiver. This circuit is an ECL AND gate, composed of two transistors T21, T22 connected to one another by their emitters, and whose collectors are each connected to ground by way of a resistor. Two other transistors T23, T24 have their emitters connected to the collector of a fifth transistor T25, whose emitter is connected to the potential Vss by way of a resistor. The collector of the transistor T23 is connected to the emitters of the transistors T21 and T22, while the collector of the transistor T24 is connected to the collector of the transistor T22. The base of the transistor T25 receives the polarization voltage Vref. The bases of the transistors T21 and T22 receive the voltages V* and V, respectively. The bases of the transistors T23 and T24 receive the line activity signals VAL and VAL*, respectively, which are furnished by the circuit of FIG. 4 by way of a voltage level offset circuit, not shown. The voltages s* and s of the collectors of the transistors T21 and T22, constitute the differential reception signals that can be used downstream in the remainder of the circuit.

In terms of the operation of the circuit of FIG. 5, it is easy to confirm that it operates as a differential amplifier when the differential signal VAL, VAL* assumes the value of logical 1, because the transistor T23 is conducting and the transistor T24 is blocked. If contrarily, VAL, VAL* assumes the value of logical 0, the transistor T23 is blocked and the transistor T24 is conducting. As a result, the signal s is in the low state and the signal s* is in the high state, thus forcing the differential output of the circuit to the value of logical 0.

I claim:

1. A method for detecting signal transmission in a transmission system using at least one transceiver connected via two differential transmission lines (L, L*) to a similar remote transceiver, said at least one transceiver including differential amplification means (1) for producing differential transmission and reception signals;

said differential amplification means (1) including: an adaptation impedance (R, R*) for adaptation to and connected with each of said two differential transmission lines; a transmission signal generator (T1, T1*, S1) commanded in response to transmission command signals (e, e*) for supplying transmission signals to said adaptation impedance (R, R*) and each of said two differential transmission lines (L, L*); and reception means (T2, T2*, r, S2) for furnishing measurement signals (V, V*) that are representative of the algebraic sum of a current circulating in said adaptation impedance (R, R*) and a compensation current, said compensation current being supplied by said differential amplification means such that said measurement signals (V, V*) depend on transmission signals produced by the remote transceiver;

power supply means connected to said differential amplification means; and means for generating a power command signal (AUTO) for actuating and inhibiting said power supply means in response thereto, said method comprising the steps of:

determining for each transceiver a threshold value (Vt) which is between a maximum and a minimum value reached by said measurement signals (V, V*), comparing said measurement signals with said threshold value (Vt) and producing a signal (VAL, VAL*) representative of transmission activity as a function of results of said comparing step.

2. The method of claim 1, characterized in that said signal representative of transmission activity is produced when one of said measurement signals (V, V*) represents a current higher in absolute value than said threshold value ($V_t$).

3. The method of claim 1, characterized in that said signal representative of transmission activity is produced when said measurement signals are simultaneously less in absolute value than said threshold value ($V_t$).

4. A circuit for detecting signal transmissions in a transmission system having at least one transceiver connected via two differential transmission lines (L, L*) to a similar remote transceiver, said at least one transceiver including differential amplification means (1) for producing differential transmission and reception signals; said differential amplification means (1) including: an impedance (R, R*) for adaptation to and connected with each of said two differential transmission lines; a transmission signal generator (T1, T1*, S1) commanded in response to transmission command signals (e, e*) for supplying transmission signals to said impedance (R, R*) and each of said two differential transmission lines (L, L*), and reception means (T2, T2*, r, S2) for furnishing measurement signals (V, V*) that are representative of the algebraic sum of a current circulating in said impedance (R, R*) and a compensation current, said compensation current being supplied by said differential amplification means such that said measurement signals (V, V*) depend on the transmission signals produced by the remote transceiver;

power supply means connected to said differential amplification means;

means for generating a power command signal (AUTO) for activating and inhibiting said power command supply means in response thereto;

means in each of said at least one transceiver for determining a threshold value (Vt) which is between a maximum and a minimum current value reached by said measurement signals (V, V*); and means for comparing the measurement signals with said threshold value (Vt) and for producing a signal (VAL, VAL*) representative of transmission activity as a function of said comparisons.

5. A circuit for detecting signal transmissions, as set forth in claim 4, wherein said measurement signals (V, V*) are voltages, and said means in each receiver for determining a threshold value (Vt) includes a detection circuit having a voltage generator (6) furnishing said threshold value (Vt).

6. The circuit of claim 5, further including two comparators (C, C*) for respectively comparing said measurement signals (V, V*) with said threshold value (Vt), wherein outputs of said comparators are applied to an input of a logic gate (7) furnishing the signal (VAL, VAL*) representative of transmission activity.

7. The circuit of claim 5, wherein said threshold value (Vt) depends on the power state of said differential amplification means (1) of said at least one transceiver, and said voltage generator (6) is a variable voltage generator, commanded by said power command signal (AUTO).

8. The circuit of claim 7, further including two comparators (C, C*) for respectively comparing said measurement signals (V, V*) with said threshold value (Vt), wherein outputs of said comparators are applied to an input of a logic gate (7) furnishing the signal (VAL, VAL*) representative of transmission activity.

9. The circuit of claim 7, characterized in that said voltage generator (6) includes a bipolar transistor (T6), having a base which is polarized by a fixed voltage (Vref), a collector connected to a first potential (Vdd) by way of a first resistor (R1) and an emitter connected to a second potential (Vss) by way of an assembly formed by a second resistor (R2), connected in parallel with a third resistor (R3, N3) capable of being disconnected in response to said power command signal (AUTO), the potential (Vto) of the collector of said transistor (T6) being representative of said threshold value (Vt).

10. The circuit of claim 8, characterized in that said voltage generator (6) includes a bipolar transistor (T6), having a base which is polarized by a fixed voltage (Vref), a collector connected to a first potential (Vdd) by way of a first resistor (R1) and an emitter connected to a second potential (Vss) by way of an assembly formed by a second resistor (R2), connected in parallel with a third resistor (R3, N3) capable of being disconnected in response to said power command signal (AUTO), the potential (Vto) of the collector of said transistor (T6) being representative of said threshold value (Vt).

11. The circuit of claim 9, characterized in that said third resistor comprises a resistor (R3) in series with a MOS transistor (N3) having a gate connected to receive the power command signal (AUTO).

12. The circuit of claim 9, characterized in that said third resistor comprises a resistor (R3) in series with a MOS transistor (N3) having a gate connected to receive the power command signal (AUTO).

13. An integrated circuit including a plurality of transceivers, each connected via two differential transmission lines (L, L*) to a similar remote transceiver, each of said transceivers including differential amplification means for producing differential transmission and reception signals over said two differential transmission lines;

said differential amplification means including: an impedance (R, R*) for adaptation to and connected with said two differential transmission lines; a transmission signal generator (T1, T1*, S1) commanded in response to transmission command signals (e, e*) and supplying said impedance (R, R*) and said two differential transmission lines (L, L*); and reception means (T2, T2*, r, S2) for furnishing measurement signals (V, V*) that are representative of the algebraic sum of a current circulating in said impedance (R, R*) and a compensation current, said compensation current being supplied by said differential amplification means such that said measurement signals (V, V*) depend practically only on transmission signals produced by the remote transceiver, said integrated circuit comprising:

means (3, S1, S2) for generating a power command signal (AUTO) for activating or inhibiting a power supply connected to said differential amplification means of each of said transceivers; and a transmission detection circuit (5) associated with each of said transceivers.

14. An integrated circuit as set forth in claim 13 wherein said transmission detection circuit includes a voltage generator (16) furnishing a threshold value (Vt).

15. The circuit of claim 10, further including two comparators (C, C*) for respectively comparing said measurement signals (V, V*) with said threshold value (Vt), wherein outputs of said comparators are applied to an input of a logic gate (7) furnishing a signal (VAL, VAL*) representing transmission activity.

16. The circuit of claim 14, wherein said threshold value (Vt) depends on the power state of said differential amplification means of said transceivers, and said voltage generator (6) is a variable voltage generator, commanded by said power command signal (AUTO).

17. The circuit of claim 15, wherein said threshold value (Vt) depends on the power state of said differential amplification means of said transceivers, and said voltage generator (6) is a variable voltage generator, commanded by said power command signal (AUTO).

18. The circuit of claim 16, characterized in that said voltage generator (6) includes a bipolar transistor (T6), having a base polarized by a fixed voltage (Vref), a collector connected to a first potential (Vdd) by way of a first resistor (R1) and an emitter connected to a second potential (Vss) by way of an assembly formed by a second resistor (R2), connected in parallel with a third resistor (R3, N3) adapted to be being disconnected in response to said power command signal (AUTO), the potential (Vto) of the collector of said transistor (T6) being representative of said threshold value (Vt).

19. The circuit of claim 17, characterized in that said voltage generator (6) includes a bipolar transistor (T6), having a base polarized by a fixed voltage (Vref), a collector connected to a first potential (Vdd) by way of a first resistor (R1) and an emitter connected to a second potential (Vss) by way of an assembly formed by a second resistor (R2), connected in parallel with a third resistor (R3, N3) adapted to be disconnected in response to said power command signal (AUTO), the potential (Vto) of the collector of said transistor (T6) being representative of said threshold value (Vt).

20. The circuit of claim 18, characterized in that said third resistor comprises a resistor (R3) in series with a MOS transistor (N3) having a gate connected to receive the power command signal (AUTO).

21. The circuit of claim 19, characterized in that said third resistor comprises a resistor (R3) in series with a MOS transistor (N3) having a gate connected to receive the power command signal (AUTO).

* * * * *

UNITED STATES PATENT AND TRADEMARK OFFICE
CERTIFICATE OF CORRECTION

PATENT NO. : 5,412,688
DATED : May 2, 1995
INVENTOR(S) : Roland MARBOT

It is certified that error appears in the above-indentified patent and that said Letters Patent is hereby corrected as shown below:

Col. 12, line 39 (Claim 12, line 1) "claim 9" should be --claim 10--.

Col. 13, line 10 (Claim 15, line 1) "claim 10" should be --claim 14--.

Col. 14, line 15 (Claim 18, line 8) "to be being disconnected" should be --to be disconnected--.

Signed and Sealed this

Fourteenth Day of November, 1995

Attest:

BRUCE LEHMAN

*Attesting Officer*  *Commissioner of Patents and Trademarks*